United States Patent [19]

Umeji

[11] Patent Number: 4,614,873
[45] Date of Patent: Sep. 30, 1986

[54] SIGNAL ISOLATOR WITH OPTICAL FIBER GROUNDING MEANS

[75] Inventor: Tadashi Umeji, Tokyo, Japan

[73] Assignee: Tokyo Shibaura Denki Kabushiki Kaisha, Kawasaki, Japan

[21] Appl. No.: 548,729

[22] Filed: Nov. 4, 1983

[30] Foreign Application Priority Data

Nov. 9, 1982 [JP] Japan ................... 57-195347

[51] Int. Cl.⁴ .............................................. G02B 27/00
[52] U.S. Cl. ................................. 250/551; 250/227; 350/96.2
[58] Field of Search ............... 250/551, 227; 350/96.2; 455/602, 610, 612; 307/311

[56] References Cited

U.S. PATENT DOCUMENTS

| | | | |
|---|---|---|---|
| 3,524,986 | 8/1970 | Harnden | 250/551 |
| 3,590,344 | 6/1971 | Roberts et al. | 250/551 |
| 3,809,908 | 5/1974 | Clanton | 250/551 |
| 3,859,536 | 1/1975 | Thiel | 250/227 |
| 4,222,629 | 9/1980 | Dassele et al. | 250/227 |
| 4,273,413 | 6/1981 | Bendiksen et al. | 250/227 |

*Primary Examiner*—David C. Nelms
*Attorney, Agent, or Firm*—Finnegan, Henderson, Farabow, Garrett & Dunner

[57] ABSTRACT

There is provided an optically controlling apparatus including light emitting diodes and optical fiber bundles which transmit light signals from these light emitting diodes to photothyristors in a controlled circuit and control the conduction states of these photothyristors. The optical fiber bundles are electrically grounded.

10 Claims, 3 Drawing Figures

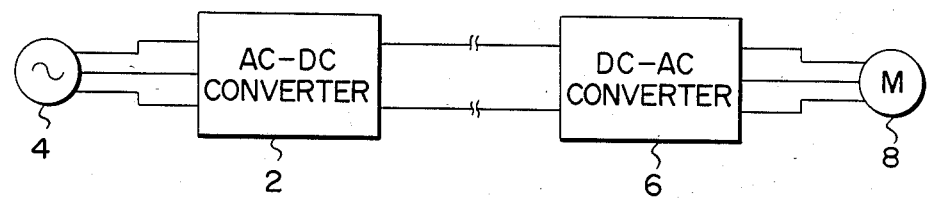
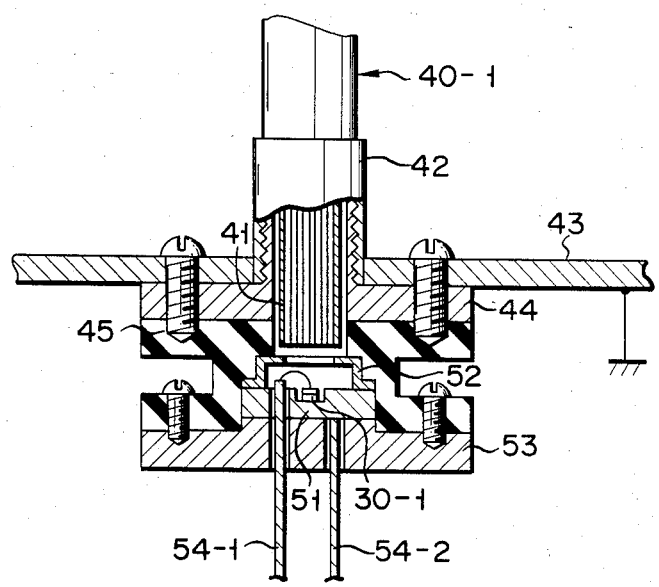

SIGNAL ISOLATOR WITH OPTICAL FIBER GROUNDING MEANS

BACKGROUND OF THE INVENTION

This invention relates to an optically controlling apparatus.

Recently, an optically controlling technology is known whereby light emitting elements which emit light signals in response to control signals from a control signal generator and optical fibers for transmitting light signals from these light emitting elements are used. The conduction states of photosensitive elements used in a controlled circuit are controlled in accordance with the light signals, thereby controlling the operation state of this controlled circuit. The control method of this kind can be also applied to the field of the power transmission and distribution which deals with high voltages.

The use of this optically controlling technology enables the operation of the controlled circuit which operates at high voltages (e.g. hundreds of kilovolts) to be controlled by generating light signals from the light emitting elements in response to control signals at low voltages (e.g. hundreds of volts). In addition, since the control signals from a control signal generator are converted into the light signals and thereafter they are transmitted to the controlled circuit through optical fiber bundles, the control signal generator will not be affected due to the electrical noise in the controlled circuit. However, as a potential difference between the controlled circuit which is made operative at high voltages and the control circuit which is made operative at low voltages increases, leakage currents flow through the optical fiber bundles for optically coupling the light emitting elements and the photosensitive elements, so that there is a possibility in that these currents damage the light emitting elements. That is, both ends of the optical fiber bundles are arranged near or in abutment with the light emitting elements and photosensitive elements to efficiently transmitting the light signals from the light emitting elements through the optical fiber bundles to the photosensitive elements. Consequently, in the cause where the controlled circuit is made operative at high voltages, each optical fiber bundle may act as a leakage current path and relatively large leakage currents flow into the light emitting elements and this is the case that the light emitting elements are damaged. In a case where the controlled circuit is made operative at low voltages, since the optical fiber bundle serves as a good insulating material, the leakage currents flowing through the optical fiber bundles are small enough to be neglected, so that they will not break the light emitting elements. Therefore, conventionally, in the case where the controlled circuit is made operative at high voltages, it was thought that it is very difficult to utilize this kind of optically controlling technology.

SUMMARY OF THE INVENTION

It is an object of the present invention to provide an optically controlling apparatus in which even when a controlled circuit is made operative at high voltages, light emitting elements will not be damaged.

This object is accomplished by an optically controlling apparatus comprising a light emitting circuit; and an optical fiber or fibers, electrically grounded, for optically coupling this light emitting circuit and a light receiving circuit in a controlled circuit and for transmitting an optical signal from the light emitting circuit to the light receiving circuit, thereby controlling the conduction state of this light receiving circuit.

In this invention, since the optical fibers are grounded, leakage currents flowing through these optical fibers do not flow into the light emitting circuit but into the ground, thereby preventing this light emitting circuit from being broken.

BRIEF DESCRIPTION OF THE DRAWINGS

FIG. 1 is a connection diagram of a DC high voltage power transmission and distribution system having an AC-DC converter including an optically controlling apparatus according to one embodiment of the present invention;

FIG. 3 illustrates a cross sectional construction of a holding member for arranging the end face of the optical fiber and light emitting element shown in FIG. 2 to face each other.

DETAILED DESCRIPTION OF THE PREFERRED EMBODIMENT

Figure 2:
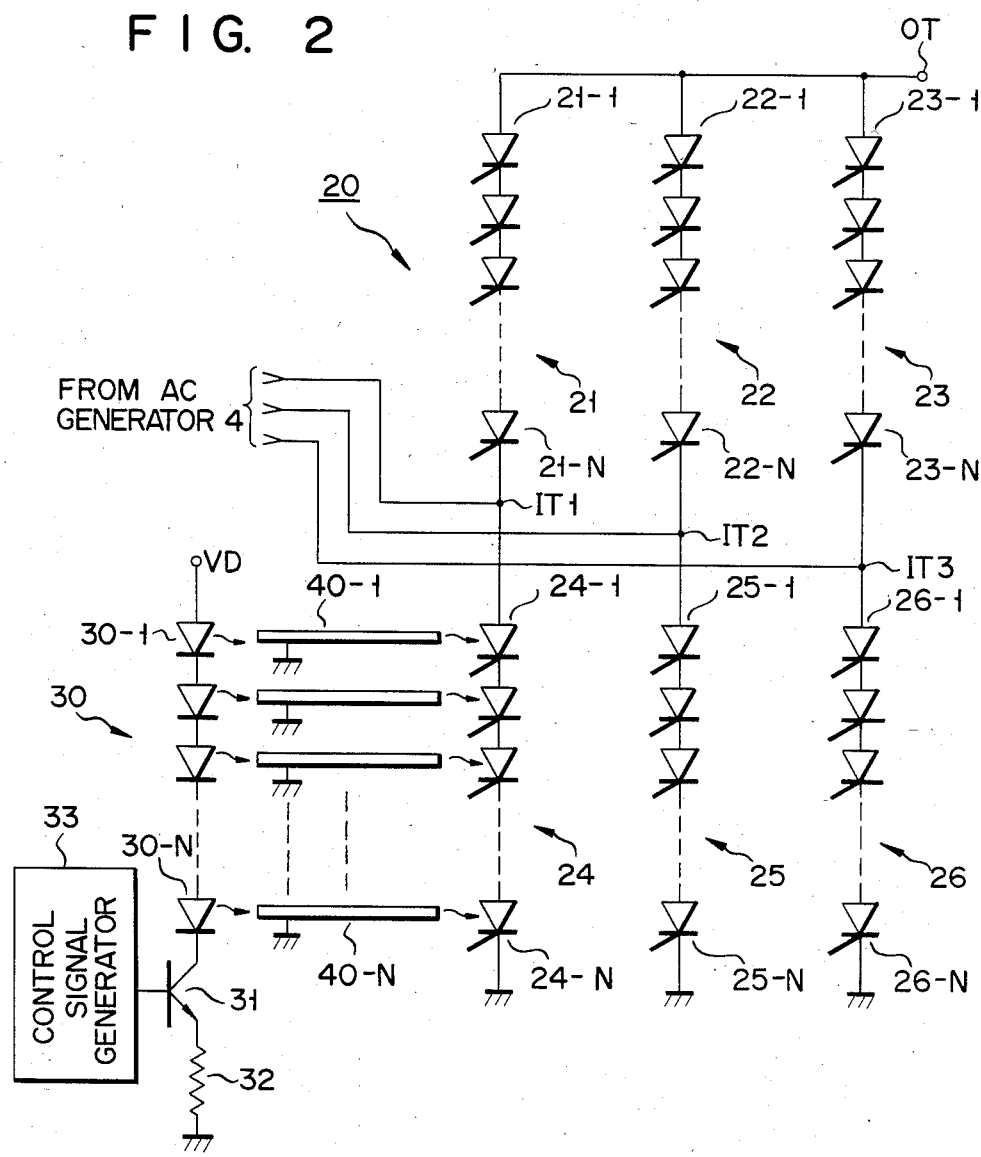
FIG. 2 is a circuit diagram showing the main part of the AC-DC converter shown in FIG. 1.

FIG. 1 schematically shows a DC power transmission system for handling high voltages which has an AC-DC converter 2 including an optical controller according to one embodiment of the present invention. This DC power transmission system further comprises a three-phase AC generator 4 whose output voltage is converted into a DC voltage by the AC-DC converter 2, a DC-AC converter 6 for converting the DC voltage from this AC-DC converter 2 into a three-phase AC voltage; and an AC motor 8 to be driven by the AC voltage from this DC-AC converter 6.

FIG. 2 shows a detailed circuit diagram of the AC-DC converter 2 shown in FIG. 1. This AC-DC converter 2 includes a three-phase bridge rectifier circuit 20 which is constituted by six arms 21 to 26 each having N photothyristors 21-1 to 21-N, 22-1 to 22-N, 23-1 to 23-N, 24-1 to 24-N, 25-1 to 25-N, and 26-1 to 26-N. The arms 21 to 23 are coupled between a DC output terminal OT and respective AC input terminals IT1 to IT3, and the arms 24 to 26 are coupled between the AC input terminals IT1 to IT3 and the ground, respectively.

A control circuit for controlling the operation of this rectifier circuit 20 includes six control sections. In FIG. 2, only one of the six control sections 30 which is used to control the photothyristors 24-1 to 24-N of the arm 24 is shown for simplicity of the drawing. This control section 30 includes a series circuit of N light emitting diodes 30-1 to 30-N, a switching transistor 31 and a resistor 32 which are connected between the ground and a DC power source terminal VD to which a DC voltage of, e.g. 550 V is applied, and a control signal generator 33 for controlling the conduction state of this switching transistor 31. The light emitting diodes 30-1 to 30-N are optically coupled to the photothyristors 24-1 to 24-N of the arm 24 through optical fiber bundles 40-1 40-N which are electrically grounded, respectively. N photothyristors (not shown) of each of the arms 21 to 23, 25 and 26 are also controlled by light signals to be transmitted from control sections (not shown) which are constituted in the same manner as the control section 30 shown in FIG. 2 through N optical fiber bundles (not shown) which are electrically grounded, respectively.

In the control section 30, when a high-level control signal is generated from the control signal generator 33, the transistor 31 is turned on and a current flows through the light emitting diodes 30-1 to 30-N, so that light signals are generated from these light emitting diodes 30-1 to 30-N. The light signals from these light emitting diodes 30-1 to 30-N are transmitted to the photothyristors 24-1 to 24-N of the arm 24 through the optical fiber bundles 40-1 to 40-N, respectively. These photothyristors 24-1 to 24-N are triggered in response to those light signals. A DC output voltage is derived from the output terminal OT by sequentially energizing the arms 21 to 26 in the predetermined sequence in response to an AC output voltage from the generator 4. It is now assumed, for example, that a DC voltage of 250 kV is generated from this output terminal OT. In this case, each of the arms 21 to 26 is required to have a withstanding voltage of not lower than 125 kV. For instance, 125 kV is applied to the input terminal IT1 coupled to the arm 24, so that a potential difference between this input terminal IT1 and the power source terminal VD becomes about 124.5 kV. Due to this large potential difference, leakage currents flow through the optical fiber bundles 40-1 to 40-N which are electrically insulating material. However, these leakage currents are discharged to the ground and do not flow to the light emitting diodes 30-1 to 30-N; therefore, these light emitting diodes 30-1 to 30-N will not be damaged.

FIG. 3 illustrates a cross sectional construction of a coupling section for supporting the light emitting diode 30-1 and the end face of the optical fiber bundle 40-1 to face each other. The optical fiber bundle 40-1 is formed in such a manner that, e.g. a bundle of quartz fibers excluding the end portion is coated by a coating of silicon resin and the end portion is enclosed in a metal tube 41. A connector plug 42 is attached to this optical fiber bundle 40-1.

The above-mentioned coupling section includes a conductive chassis 43, a conductive connector socket 44 of, e.g. brass which is attached to this chassis 43 so as to be electrically coupled to this chassis 43, and an insulating member 45 made of, e.g. Teflon resin which is fixed to this connector socket 44. Through holes adapted to receive the end portion of the optical fiber bundle 40-1 are formed in the chassis 43, connector socket 44 and insulating member 45. By threadably fixing the connector plug 42 into the connector socket 44 in the state such that the end portion of this optical fiber bundle 40-1 is inserted in these through holes, the optical fiber bundle 40-1 is fixed to this coupling portion.

On the other hand, the light emitting diode 30-1 is attached on a metal stem 51. A cover plate 52 is attached on the upper surface of this metal stem 51 to cover the light emitting diode 30-1, and a cooling body 53 for radiating the heat to be caused due to the light emitting operation of the light emitting diode is attached to the back surface of this metal stem 51. The cover plate 52 is formed with a window for permitting the light from the light emitting diode 30-1 to pass to the end portion of the optical fiber bundle 40-1. A pair of insulated leads 54-1 and 54-2 for applying a control voltage to the light emitting diode 30-1 are electrically coupled to both electrodes of this light emitting diode 30-1.

In the coupling section shown in FIG. 3, the light emitting diode 30-1 is insulated from the optical fiber bundle 40-1 by the insulating member 45, and this optical fiber bundle 40-1 is grounded through the connector plug 42, connector socket 44 and chassis 43. Thus, a leakage current flowing from the rectifier circuit 20 through this optical fiber bundle 40-1 does not flow to the light emitting diode 30-1 but is discharged to the ground through the connector plug 42, connector socket 44 and chassis 43.

The present invention has been described in the above with respect to one embodiment; however, the present invention is not limited to only this embodiment. For example, in FIG. 2, an optically controlling apparatus is used to control the rectifier circuit 20, but this optically controlling apparatus can be advantageously employed to control the operation of other circuits which may be operated at high voltages.

What is claimed is:

1. An electro-optical system to optically control a circuit comprising:
    light elmitting means operatively connectible to a first voltage;
    light receiving means provided in the circuit and operatively connectible to a second voltage souce having a higher voltage than said first voltage source;
    optical fiber means arranged electrically isolated from said light emitting means and operable to transmit light signals from said light emitting means to said light receiving means to control the conduction states of said light receiving means; and
    grounding means for electrically grounding said optical fiber means to cause leakage currents flowing through said optical fiber means to be discharged to ground.

2. An electro-optical system to optically control a circuit according to claim 1, wherein said optical fiber means has a connector portion attached to one end portion thereof and said grounding means has a grounded chassis which is electrically connected to said connector portion.

3. An electro-optical system to optically control a circuit according to claim 2, wherein said light emitting means comprises a series circuit of a plurality of light emitting elements and switching mean and a control signal generator for controlling the conduction state of said switching means.

4. An electro-optical system to optically control a circuit according to claim 3, further comprising an insulating member for electrically isolating and holding said light emitting elements from said optical fiber means.

5. An electro-optical system to optically control a circuit according to claim 1, wherein said light emitting means comprises a series circuit of a plurality of light emitting elements and switching means and a control signal generator for controlling the conduction state of said switching means.

6. An electro-optical system to optically control a circuit according to claim 5, further comprising an insulating member for electrically isolating and holding said light emitting elements from said optical fiber means.

7. An electro-optical system to optically control a circuit as recited in claim 3, wherein said light receiving means comprises a series circuit of a plurality of light receiving elements.

8. An electro-optical system to optically control a circuit as recited in claim 4, wherein said light receiving means comprises a series circuit of a plurality of light receiving elements.

9. An electro-optical system to optically control a circuit as recited in claim 5, wherein said light receiving means comprises a series circuit of a plurality of light receiving elements.

10. An electro-optical system to optically control a circuit as recited in claim 6, wherein said light receiving means comprises a series circuit of a plurality of light receiving elements.

* * * * *